(12) United States Patent
Wang

(10) Patent No.: US 6,784,357 B1
(45) Date of Patent: Aug. 31, 2004

(54) SOLAR ENERGY-OPERATED STREET-LAMP SYSTEM

(76) Inventor: Chao Hsiang Wang, P.O. Box 82-144, Taipei (TW)

(*) Notice: Subject to any disclaimer, the term of this patent is extended or adjusted under 35 U.S.C. 154(b) by 51 days.

(21) Appl. No.: 10/067,357

(22) Filed: Feb. 7, 2002

(51) Int. Cl.[7] .......................... H01L 31/042; F21S 13/10
(52) U.S. Cl. ....................... 136/244; 136/291; 136/251; 362/183; 362/159; 362/431
(58) Field of Search ................. 136/291, 244, 136/251; 362/183, 159, 431

(56) References Cited

U.S. PATENT DOCUMENTS

| | | | | |
|---|---|---|---|---|
| 4,200,904 A | * | 4/1980 | Doan | 362/183 |
| 4,281,369 A | * | 7/1981 | Batte | 362/183 |
| 5,055,984 A | * | 10/1991 | Hung et al. | 362/163 |
| 5,149,188 A | * | 9/1992 | Robbins | 362/183 |
| 6,060,658 A | * | 5/2000 | Yoshida et al. | 136/291 |
| 2002/0176248 A1 | * | 11/2002 | Wismeth et al. | 362/159 |

FOREIGN PATENT DOCUMENTS

| | | | |
|---|---|---|---|
| JP | 10-241424 A | * | 9/1998 |
| JP | 2000-57815 A | * | 2/2000 |

* cited by examiner

*Primary Examiner*—Alan Diamond
(74) *Attorney, Agent, or Firm*—Leong C. Lei

(57) ABSTRACT

A solar energy-operated street-lamp device is disclosed. The solar energy-operated street-lamp device is characterized in that the solar energy-operated device includes a solar energy-operated absorption board, a circuit board and a storage battery that is mounted within a post seat of the lamp-post. The power stored in the storage battery will be delivered to an LED via circuit board to provide illumination. The solar energy absorption board and the transparent protective hood are of arc-shape so that the sunlight can be converged onto the solar energy absorption board and at the same time, dust particles and birds' excrement or fallen leaves will not be collected on the surface of the hood surface.

4 Claims, 9 Drawing Sheets

SOLAR ENERGY-OPERATED STREET-LAMP SYSTEM

BACKGROUND OF THE INVENTION (a) Field of the Invention

The present invention relates to a solar energy-operated street-lamp system, and in particular, to a street-lamp system which can be utilized on lamp post erected along the roadside or along road dividers.

(b) Description of the Prior Art

Conventional street-lamp system is operated by electrical energy that provided by a power company, and light bulbs used on his system will normally produce a high temperature and this high temperature is unfavorable to the light bulb, as the temperature will shorten the longevity of the light bulb. Furthermore, the street-lamp with this light bulb is difficult to maintain, and the cost of bulb replacement is rather high.

Accordingly, it is an object of the present invention to provide a solar energy-operated street-lamp system, which mitigates all the drawbacks discussed above.

SUMMARY OF THE INVENTION

Accordingly, it is an object of the present invention to provide a solar energy-operated street-lamp system to provide self-sufficient electric power to the street-lamps, wherein the solar energy-operated device absorbs solar energy to produce power for the illumination of street-lamps.

A further object of the present invention is to provide a solar energy-operated street-lamp system, wherein a transparent protective hood mounted onto a lamp seat is a circular arc-shape and the center of the top face of the protective hood is a sharp conic shape and the shape of the protective hood will not encourage the gathering of dust particles or birds' excrement or the like on the hood, and therefore the transparent protective hood is always kept clean and clear to absorb sufficient sunlight, and the protective hood does not have dead angle to discourage the absorption of sunlight. In other words, the arc-shaped face of the internal wall of the hood possesses light focusing characteristics and is such that sufficient sunlight energy is absorbed by the solar energy absorbing board.

The foregoing object and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PRESENT INVENTION

The following descriptions are of exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
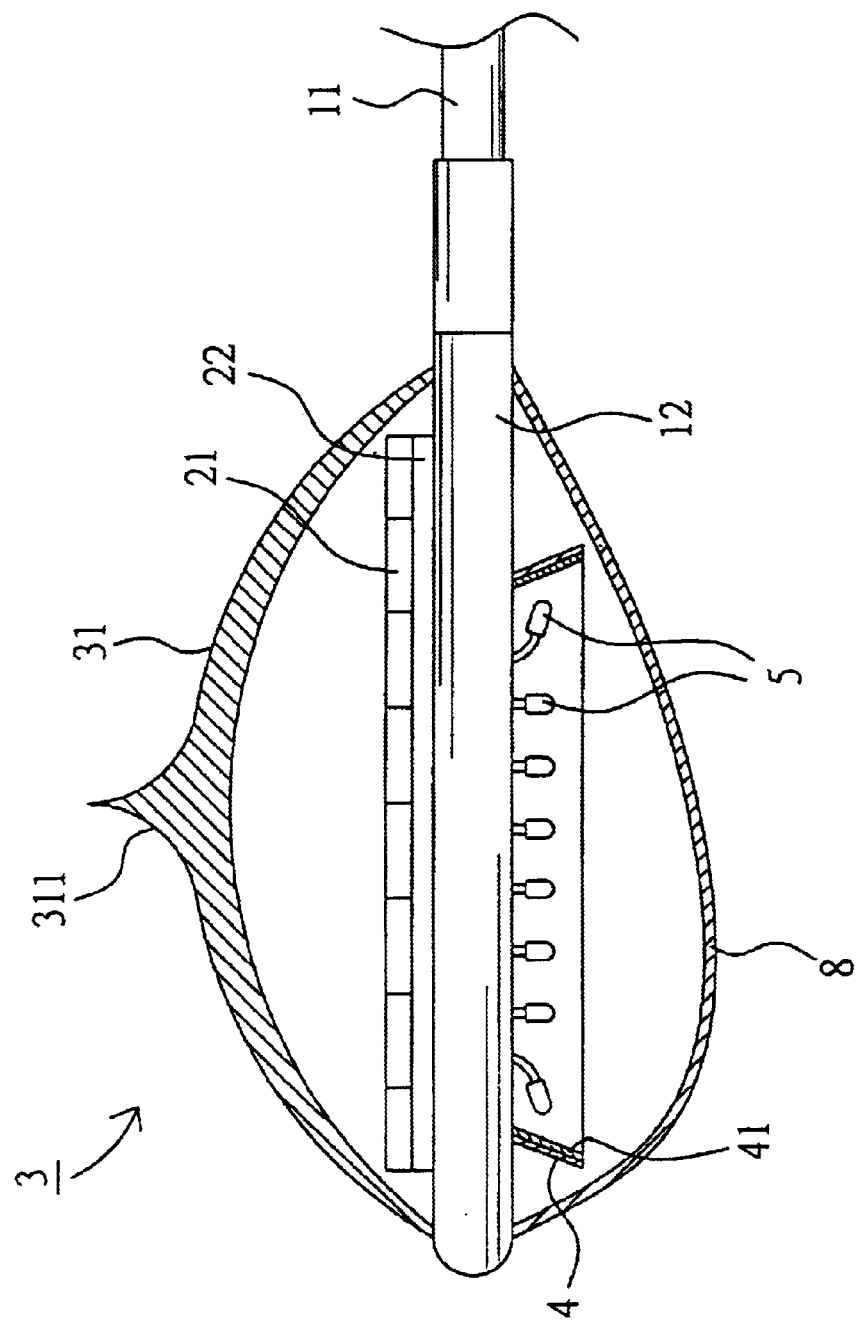
FIG. 1 is a sectional view showing the interior of the transparent protective hood of a preferred embodiment of the present invention.
Figure 2:
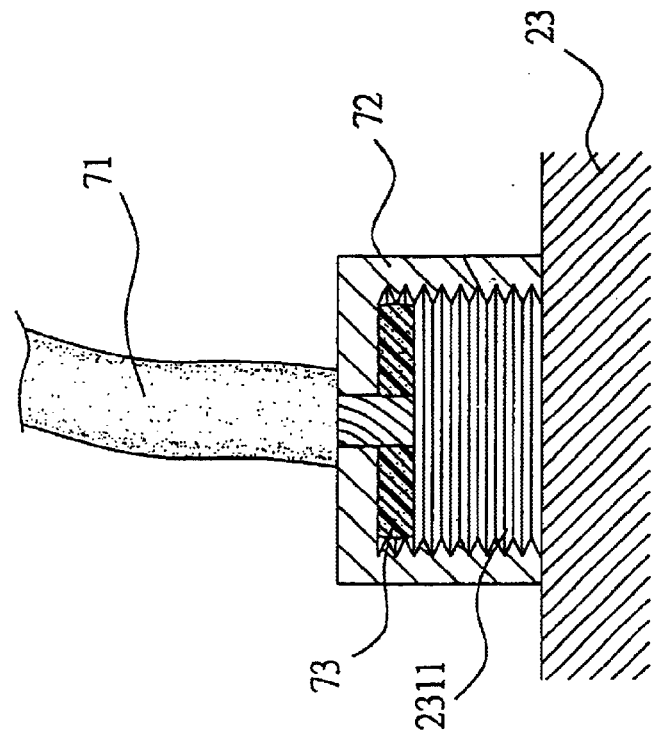
FIG. 2 is a perspective view of the storage battery of the solar energy-operated street-lamp system of the present invention.
Figure 2:
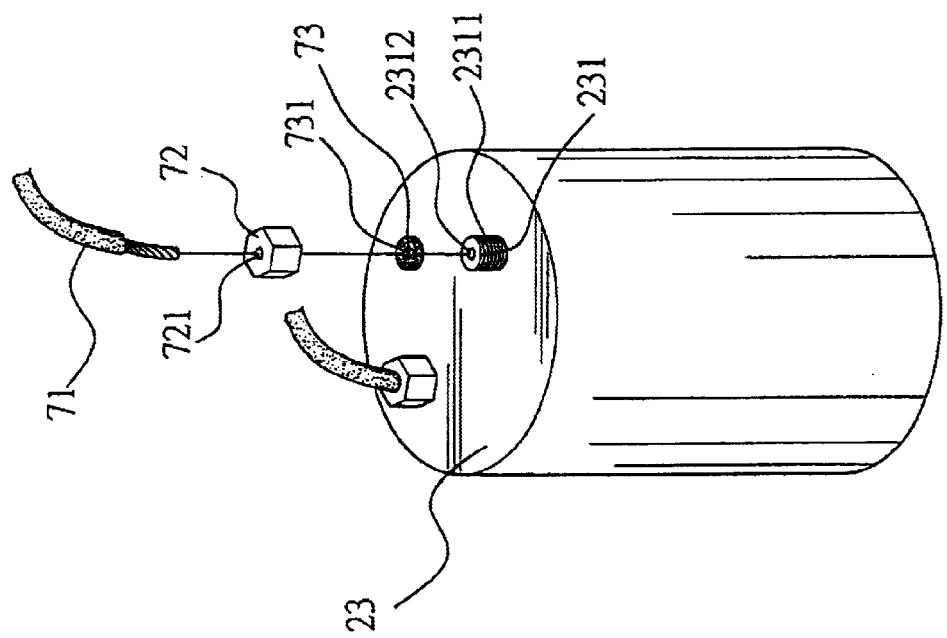
Figure 3:
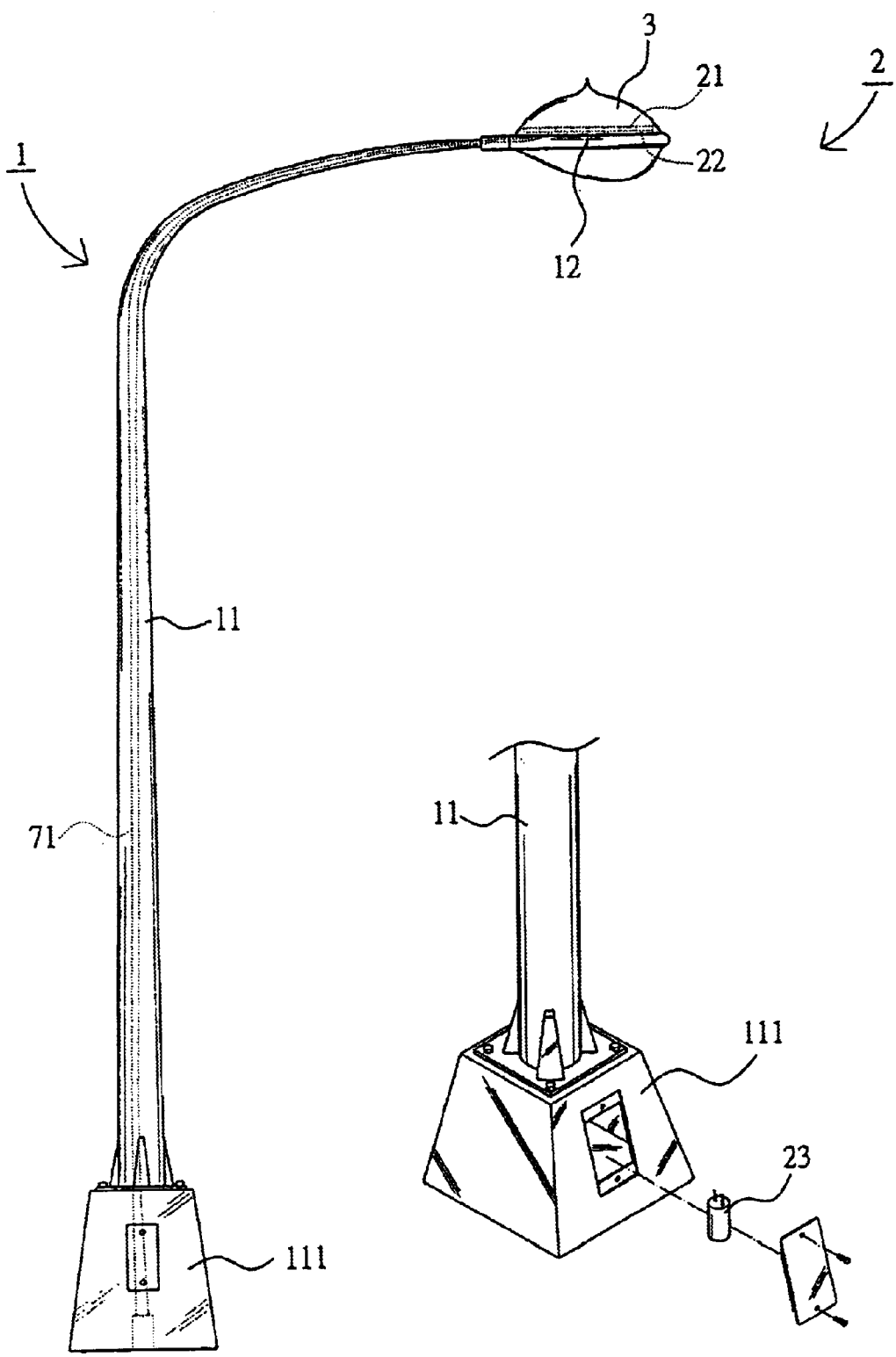
FIG. 3 is a perspective view of the solar energy-operated street-lamp system of the present invention.

Referring to FIGS. 1, 2 and 3, there is shown a solar energy-operated street-lamp system in accordance with the present invention. The solar energy-operated device 2 includes a solar energy absorption board 21, a circuit board 22 and a storage battery 23, wherein the solar energy-operated absorption board 21 comprises a plurality of solar energy batteries arranged in a row for absorption of solar energy source; the circuit board 22 is a circuit board body having a recharging circuit and an illumination circuit; and the storage battery 23 has an electrode connector 231 with external threads 2311 and a center wire insertion hole 2312, and the wire 71 is inserted into the insertion hole 2312 via the through hole 721 on the covering cap 72 and the through hole 731 of the waterproof pad 73, the covering cap 72 urges the pad 73 to the upper end of the electrode connector 231 so as to secure the wire 71, preventing current leakage as a result of water leakage.

In operation, the solar energy absorption board 21, the circuit board 22 are located within the lamp seat 12 of the street-lamp 1, and the storage battery 23 is located at the post seat 111 of the lamp post 11. The LED 5 is positioned at the focused light reflective hood 3 above the lamp seat 12.

The solar energy-operated absorption board 21 absorbs natural light in the day and stores the converted energy via the circuits of the circuit board 22 as electrical energy in the storage battery 23. During the night, the storage battery 23 releases electrical energy and the LED 5 is lighted to provide lighting. Thus, the street-lamp 1 does not need external supply of electrical energy to provide illumination, and the costs of electrical power are saved. Further, the LED 5 emits a cold white light, which is not hot, i.e., at a low temperature, and therefore, the longevity of the LED bulb is prolonged to a maximum life span of 15 years. Thus, the cost of maintenance of the bulb of the present solar energy-operated street-lamp system is saved. Further, the emitted white light of the LED 5 is a focused beam, which can provide a further range of illumination.

In accordance with the present invention, if there is insufficient sunlight energy absorption as a result of a cloudy day or a hazy day, a new storage battery 23 located at the post seat 111 can be easily replaced. In order to prevent water leakage into the storage battery 23, the wire 71 is mounted to the insertion hole 2312 such that the wire 71 is first passed through the through hole of the covering cap 72, then to the through hole 731 of the pad 73 so that the pad 73 is urged to the electrode connector 231. The covering cap 72 presses the pad 73 so that the wire 71 at the connector 231 is secured. Thus, water leakage is prevented and the street-lamp 1 will function normally.

In accordance with the present invention, the center 311 of the top face of the hood surface 31 of the transparent protective hood 3 at the top of the lamp seat 12 is a conic shape and is converged into a conic body, and the hood surface 31 of has undergone a smooth treatment process. Thus, particles or dust, birds' excrement, or fallen leaves will not be collected on the hood surface 31 to form a covering layer on the hood surface 31 to block the sunlight from reaching the sunlight absorption board 21. In other words, the arc-shaped hood surface 31 can be cleaned by strong wind or rain water so that the surface 31 is always clean and clear. There is no dead angle on the surface 31 and the sunlight can be converged onto the solar energy absorption board 21. This will increase the absorption efficiency of the board 21. In other words, the storage battery 23 is completely charged within a short time. The transparent protective hood 3 may have multiple sides which produce refraction, and can also provide an aesthetic view to the protective hood 3.

Figure 4:
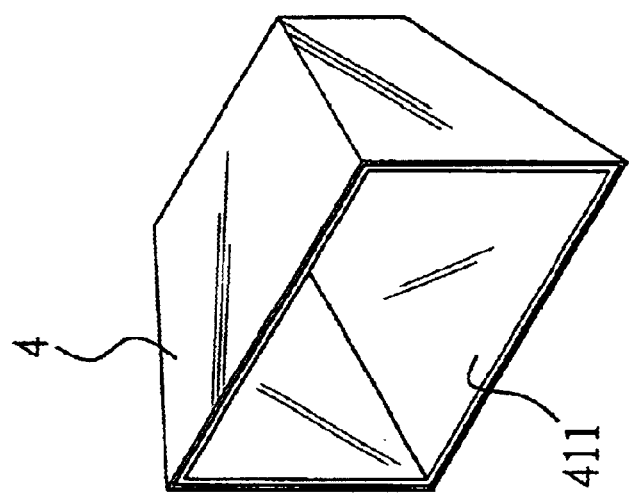
FIG. 4 shows a perspective view of the light-focused reflective hood of a solar energy-operated street-lamp system of the present invention.
Figure 4:
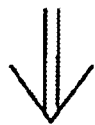
Figure 4:
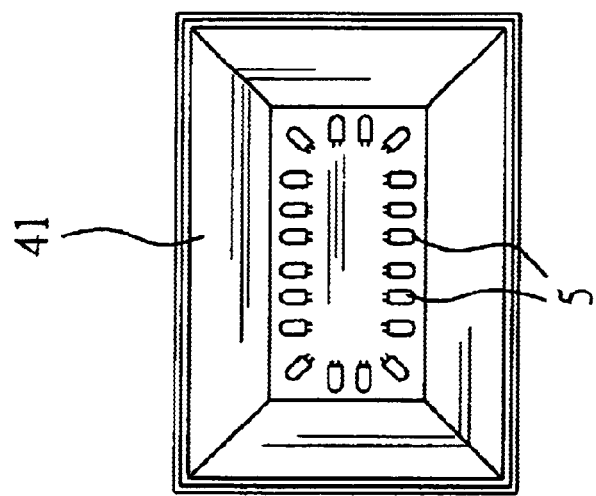
Figure 5:
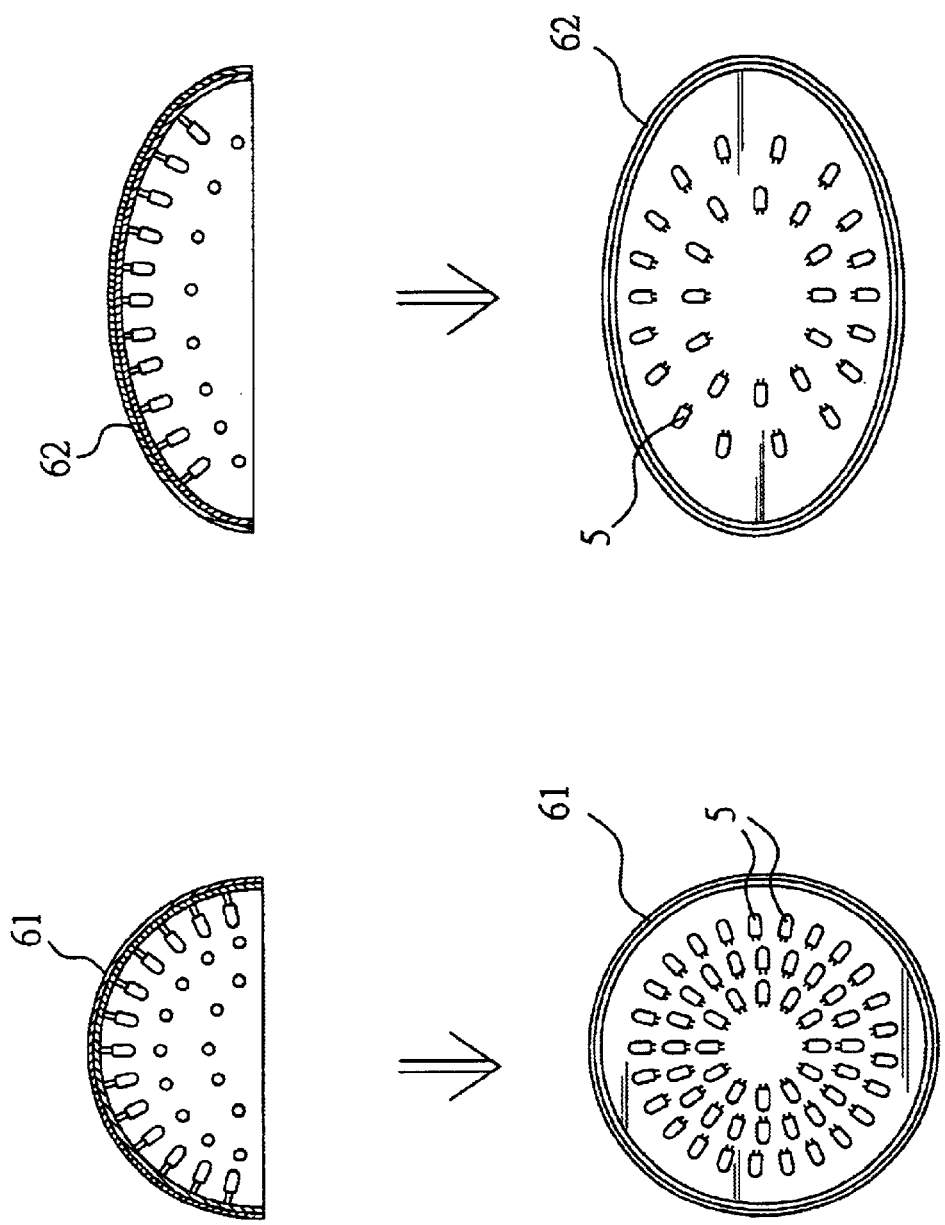
FIG. 5 shows a sectional view of the light-focused reflective hood of a solar energy-operated street-lamp system of the present invention.
Figure 6:
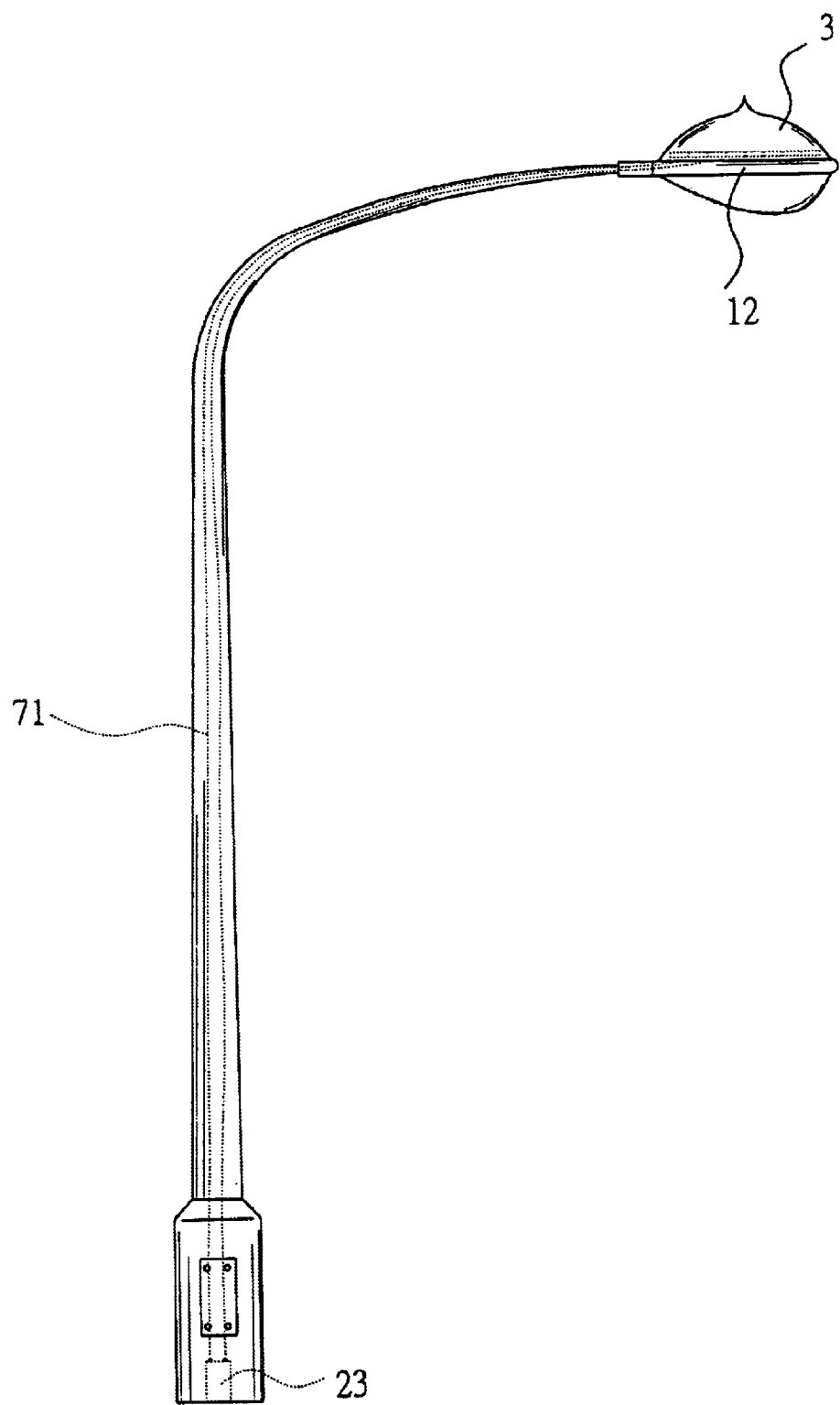
FIGS. 6, 7 and 8 show perspective views of other preferred embodiments of the solar energy-operated street-lamp system of the present invention.
Figure 7:
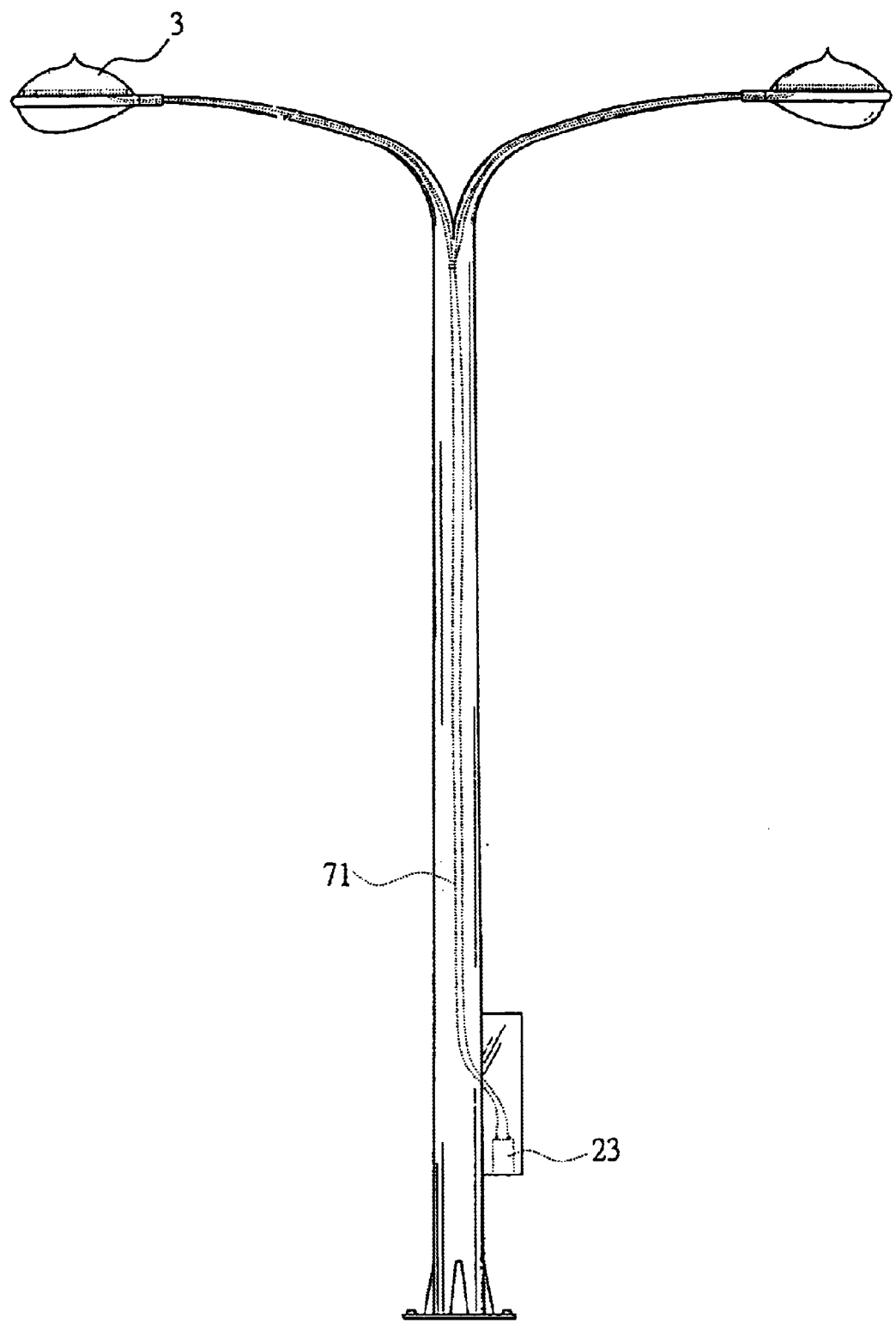
Figure 8:
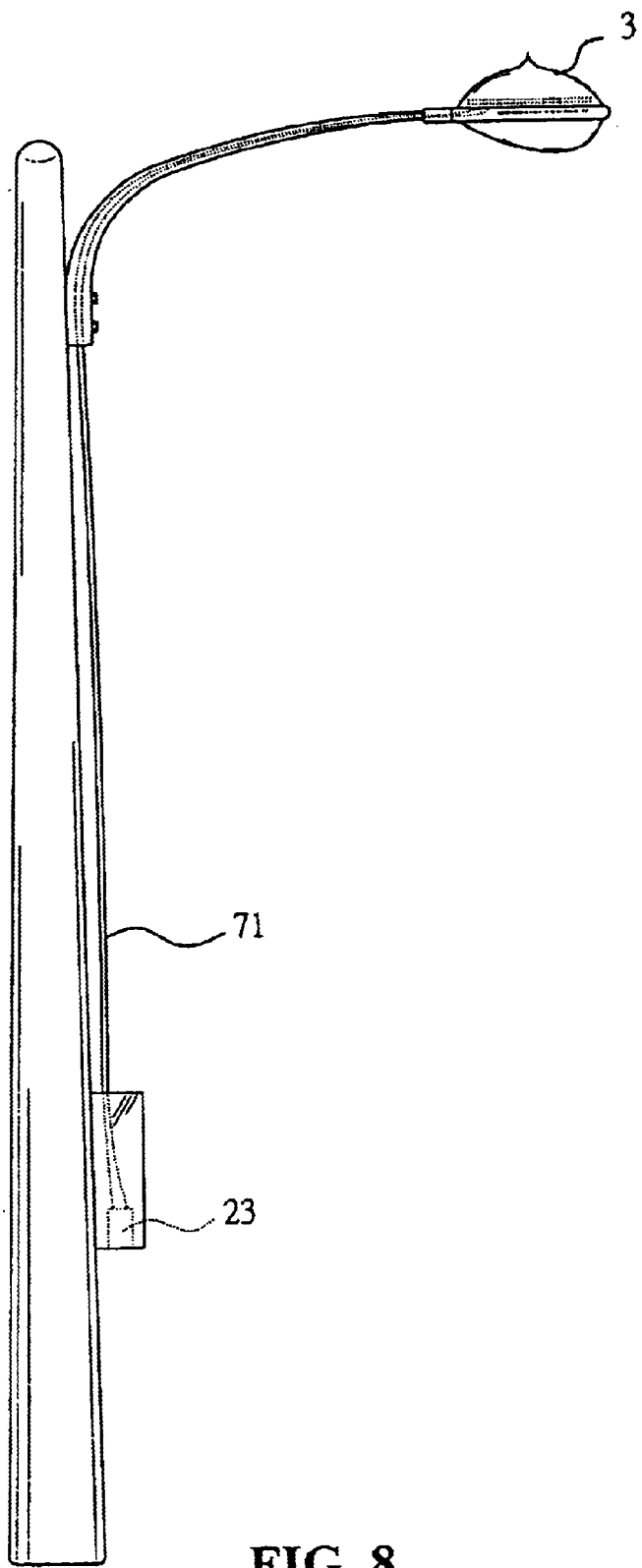

Referring to FIGS. 1 and 4, a light-focused reflective hood 4 is positioned below the lamp seat 12 and is a conic shape. The inner wall of the reflective hood 4 is provided with a mirror surface 41 and a plurality of LEDs 5 are provided on the top of the hood 4 and are facing the adjacent mirror surface 41. Therefore, the reflection of the mirror surface 41 causes brightness after a number of reflections of light when emitted by the LEDs 5. Besides, as shown in FIG. 5, the light-focused reflective hood 4 may be a circular conic-shape reflective hood 61 or oval-conic shape reflective hood 62 which allow more light focusing by the reflective hood 4. The number of the LEDs 5 can be adjusted based on requirement so as to increase the scope of the brightness and the depth of the illuminated range. In addition, the illuminated light passed through a colored diffusion lamp shade 8 will produce corresponding color so that the street-lamp 1 provides an aesthetic effect.

Figure 9:
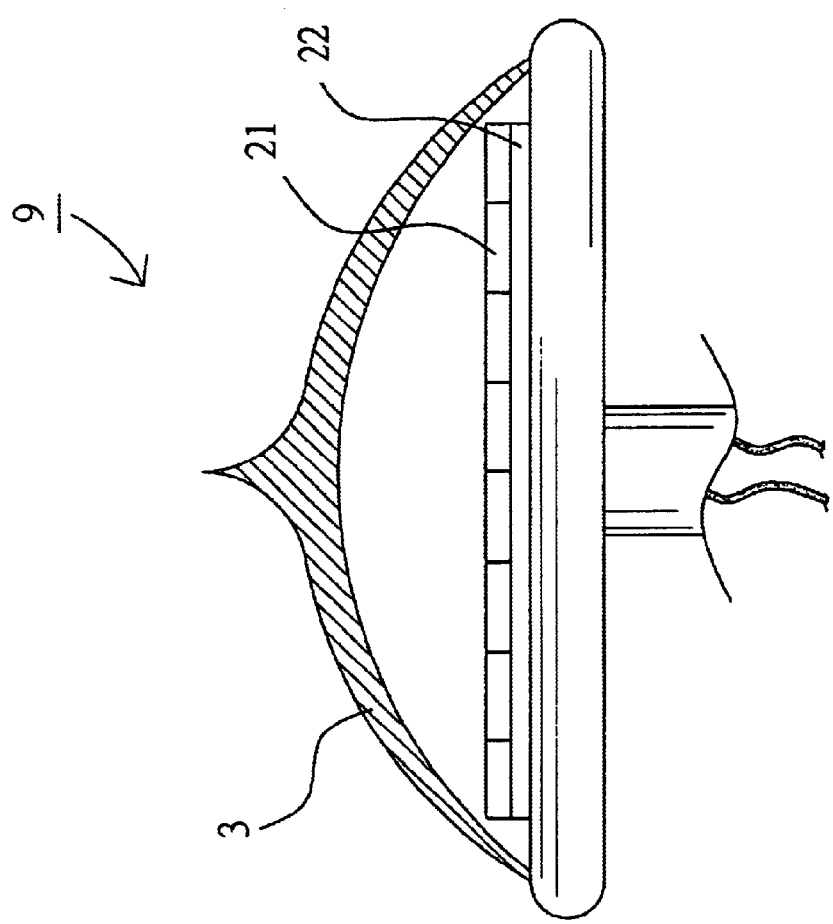
FIG. 9 schematically shows the solar energy light-absorbing body used in a solar energy-operated street-lamp system in accordance with the present invention.

In accordance with the present invention, the solar energy-operated device 2 can be installed on street-lamp posts along the street, roadsides, or road divider (as shown in FIGS. 3, 6, 7 and 8), and therefore the installation of the street-lamp post of the present invention will provide safety to the road or street user. Referring to FIG. 9, the solar energy absorption board 21, the circuit board 22 and the protective hood 3 can be independently mounted to a sunlight absorption body 9, thereby the body 9 will extend the absorption of sunlight so that the lamp-post can be installed within channels or to provide illumination for buildings.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A solar energy-operated street-lamp device comprising a solar energy absorption board and a circuit board each located within a lamp seat of a street-lamp; and a storage battery; wherein the solar energy absorption board comprises a plurality of solar energy batteries arranged in a row for absorption of solar energy; the circuit board is a circuit board body having a recharging circuit for recharging the storage battery and an illumination circuit for illuminating LEDs; energy converted by the solar energy absorption board is stored via the circuit board as electrical energy in the storage battery; and the storage battery is provided with an electrode connector with external threads and a center wire insertion hole, and a wire is inserted into the insertion hole via a through-hole on a covering cap and a through-hole of a waterproof pad, the covering cap urges the pad to an upper end of the electrode connector so as to secure the wire, preventing current leakage as a result of water leakage; a center of a top face of a hood surface of a transparent protective hood at a top of the lamp seat has a conic shape and is converged into a conic body; a light-focused reflective hood is positioned below the lamp seat and has a conic shape, and an inner wall of the reflective hood is provided with a mirror surface and a plurality of LEDs are provided on a top of the reflective hood and are facing the mirror surface; and a colored diffusion lamp shade located below the reflective hood produces corresponding color when illuminated by the LEDs.

2. The solar energy-operated street-lamp device of claim 1, wherein the hood surface of the protective hood has a multiple-side conic shape.

3. The solar energy-operated street-lamp device of claim 1, wherein the protective hood has undergone a smooth treatment process so that particles, dust, bird feces, or fallen leaves do not collect thereon.

4. The solar energy-operated street-lamp device of claim 1, wherein the transparent protective hood has a pointed conic shape.

* * * * *